US012224017B2

(12) United States Patent
Rao et al.

(10) Patent No.: US 12,224,017 B2
(45) Date of Patent: Feb. 11, 2025

(54) READ LEVEL COMPENSATION FOR PARTIALLY PROGRAMMED BLOCKS OF MEMORY DEVICES

(71) Applicant: Micron Technology, Inc., Boise, ID (US)

(72) Inventors: Nagendra Prasad Ganesh Rao, Folsom, CA (US); Paing Z. Htet, Union City, CA (US); Sead Zildzic, Jr., Folsom, CA (US); Thomas Fiala, Folsom, CA (US); Jian Huang, Union City, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 261 days.

(21) Appl. No.: 17/942,977

(22) Filed: Sep. 12, 2022

(65) Prior Publication Data
US 2024/0087655 A1 Mar. 14, 2024

(51) Int. Cl.
*G11C 16/30* (2006.01)
*G11C 16/08* (2006.01)
*G11C 16/16* (2006.01)
*G11C 16/26* (2006.01)

(52) U.S. Cl.
CPC .............. *G11C 16/26* (2013.01); *G11C 16/08* (2013.01); *G11C 16/16* (2013.01)

(58) Field of Classification Search
CPC ......... G11C 16/26; G11C 16/08; G11C 16/16; G11C 16/0483; G11C 11/5642; G11C 16/30; G11C 16/3495; G11C 16/3418; G11C 16/3427; G11C 8/08
See application file for complete search history.

(56) References Cited

U.S. PATENT DOCUMENTS

| | | | |
|---|---|---|---|
| 10,950,315 B1* | 3/2021 | Jeon | G06F 9/30101 |
| 11,475,969 B2* | 10/2022 | Muchherla | G11C 11/4085 |
| 11,742,029 B2* | 8/2023 | Xu | G11C 16/32 365/189.011 |
| 2018/0107540 A1* | 4/2018 | Lee | G11C 16/3431 |
| 2018/0174640 A1* | 6/2018 | Gupta | G11C 11/413 |
| 2021/0366539 A1* | 11/2021 | Kim | H01L 24/08 |
| 2023/0117717 A1* | 4/2023 | Takada | G06F 3/0604 714/764 |
| 2023/0197157 A1* | 6/2023 | Kadasani | G11C 11/5642 365/230.03 |
| 2024/0094957 A1* | 3/2024 | Takada | G06F 3/0604 |

* cited by examiner

*Primary Examiner* — Hien N Nguyen
(74) *Attorney, Agent, or Firm* — Lowenstein Sandler LLP

(57) ABSTRACT

A system can include a memory device containing blocks made up of wordlines respectively connected to sets of memory cells, and a processing device, operatively coupled with the memory device to perform operations including responsive to receiving a read request that specifies a block, determining a value of a metric reflective of a number of programmed wordlines of the block. The operations can also include responsive to determining, based on the value of the metric, that the block is in a partially programmed state, identifying a read voltage offset corresponding to the value of the metric, and performing, using the read voltage offset, a read operation responsive to the read request.

20 Claims, 8 Drawing Sheets

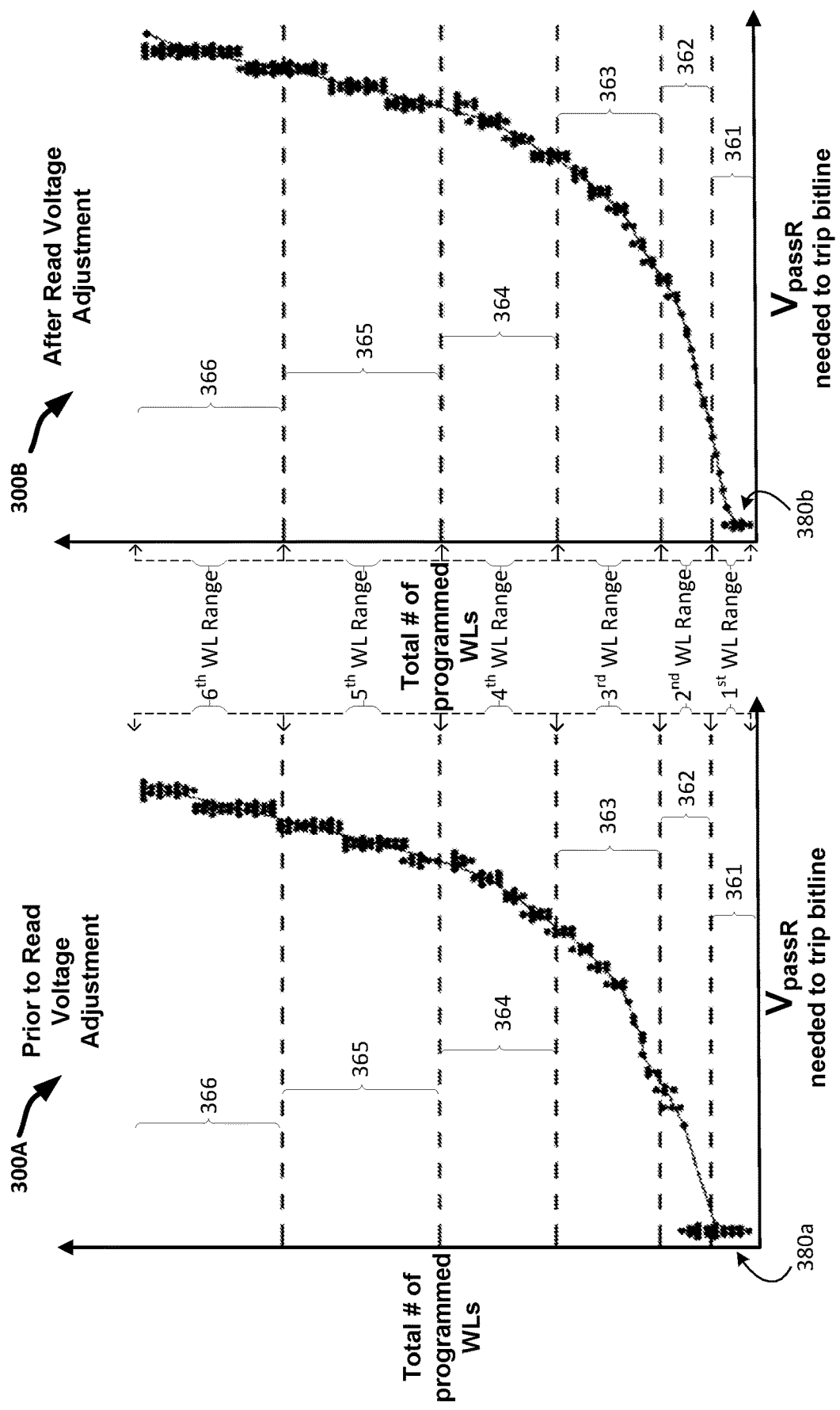

READ LEVEL COMPENSATION FOR PARTIALLY PROGRAMMED BLOCKS OF MEMORY DEVICES

TECHNICAL FIELD

Embodiments of the disclosure generally relate to memory sub-systems, and more specifically, relate to managing compensation and adjustment of voltage levels for reading partially programmed blocks on memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3A depicts a graph of a plot, illustrating the relationship between the number of programmed wordlines (WLs) with corresponding pass-through voltages ($V_{passR}$) required to trip bitline current, in accordance with some embodiments of the present disclosure;

FIG. 3B depicts a graph of a plot, resulting from partial block voltage level compensation, illustrating the relationship between the number of programmed wordlines (WLs) with corresponding pass-through voltages ($V_{passR}$) required to trip bitline current, in accordance with some embodiments of the present disclosure;

DETAILED DESCRIPTION

Figure 1:
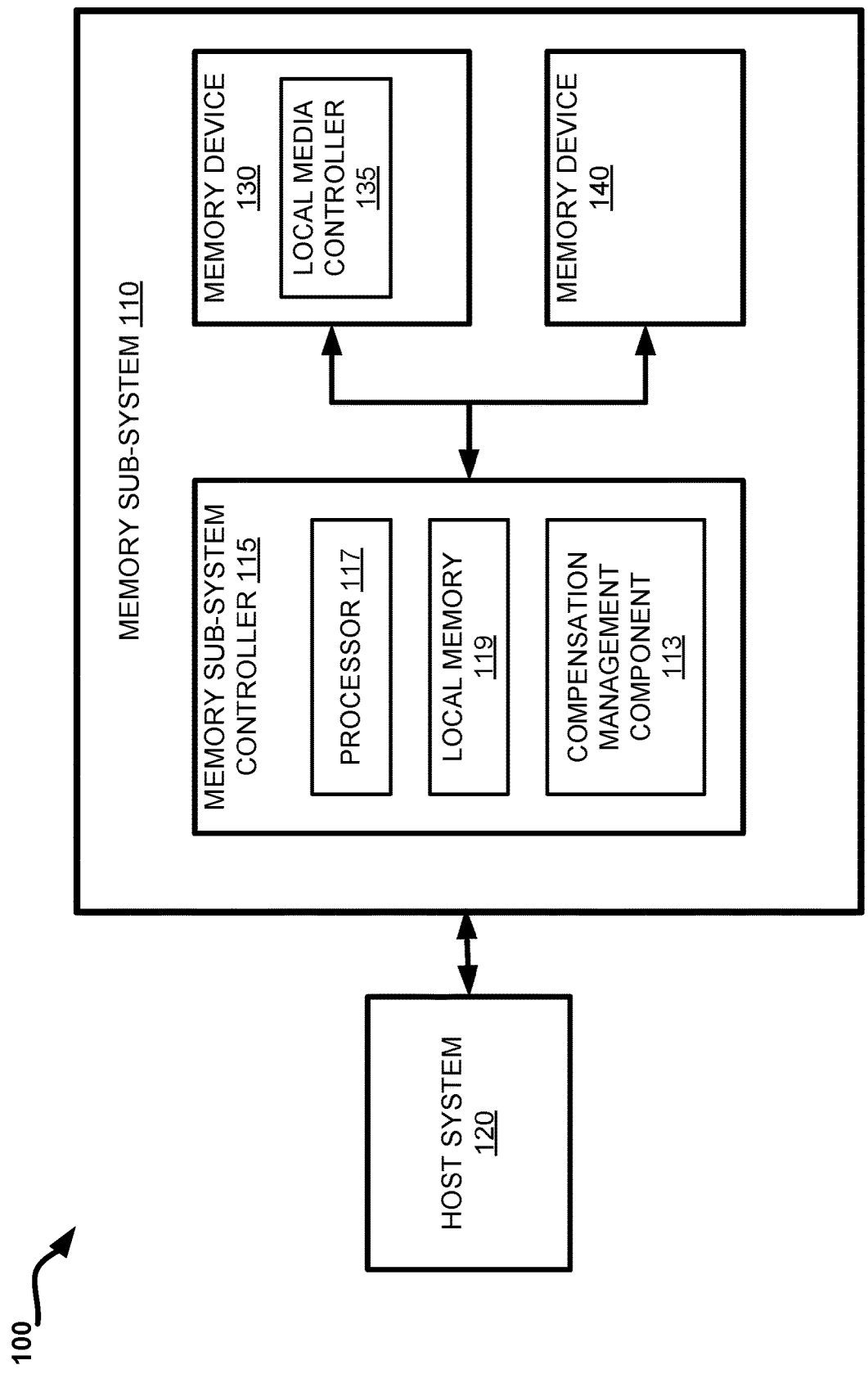
FIG. 1 illustrates an example computing system that includes a memory sub-system in accordance with some embodiments of the present disclosure.

Aspects of the present disclosure are directed to read voltage level compensation for partially programmed blocks of memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane can consist of a set of physical blocks. In some embodiments, each block can include multiple sub-blocks. Each block can consist of a set of pages. Each page can consist of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or three-dimensional grid. Memory cells can be etched onto a silicon wafer in an array of columns connected by conductive lines (also hereinafter referred to as bitlines or BLs) and rows connected by conductive lines (also hereinafter referred to as wordlines or WLs). A wordline can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q,V_t)=dW/dV_t$, where dW represents the probability that any given cell has its threshold voltage within the interval $[V_t, V_t+dV_t]$ when charge Q is placed on the cell.

A programming operation can be performed by applying a series of incrementally increasing programming pulses to the control gate of a memory cell being programmed. A program verify operation after each programming pulse can determine the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A program verify operation involves applying a ramped voltage to the control gate of the memory cell being verified. When the applied voltage reaches the threshold voltage of the memory cell, the memory cell turns on and sense circuitry detects a current on a bit line coupled to the memory cell. The detected current activates the sense circuitry and determines the present threshold voltage of the cell. The sense circuitry can determine whether the present threshold voltage is greater than or equal to the target threshold voltage. If the present threshold voltage is greater than or equal to the target threshold voltage, further programming is not needed. Otherwise, programming continues in this manner with the application of additional program pulses to the memory cell until the target $V_t$ and data state is achieved.

Accordingly, certain non-volatile memory devices can use a demarcation voltage (i.e., a read reference voltage) to read data stored at memory cells. For example, a read reference voltage (also referred to herein as a "read voltage") can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or reflect a normal distribution of threshold voltages.

A memory device can exhibit threshold voltage distributions $P(Q, V_t)$ that are narrow compared with the working range of control voltages tolerated by the cells of the device. Accordingly, multiple non-overlapping distributions $P(Q_k, V_t)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_t$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_t$ exhibited by the memory cell to one or more reference voltage levels corresponding to known valley margins (e.g., centers of the margins) of the memory device in order to distinguish between the multiple logical programming levels and determine the programming state of the cell.

Precisely controlling the amount of the electric charge stored by the cell allows multiple logical levels to be distinguished, thus effectively allowing a single memory cell to store multiple bits of information. One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, (triple-level cell) TLC memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

Memory devices can experience random workloads over the course of their operation that impact the $V_t$ distributions of their memory cells. For example, the $V_t$ distributions can be shifted to higher or lower values. A temporal shift of $V_t$ (i.e., a shift of the $V_t$ distributions over a period of time), for example, can be caused by a quick charge loss (QCL) that occurs soon after programming and by a slow charge loss (SCL) that occurs as time passes during data retention. To compensate for various $V_t$ distribution shifts, calibration operations can be performed in order to adjust the read level voltages, which can be done on a distribution-by-distribution basis, as higher $V_t$ levels tend to incur more temporal shifting than do lower $V_t$ levels. In certain memory devices, read voltage level adjustments can be performed based on values of one or more data state metrics obtained from a sequence of read and/or write operations. In an illustrative example, the data state metric can be represented by a raw bit error rate (RBER), which refers to the error rate in terms of a measure of bits that contain incorrect data (i.e., bits that were sensed erroneously) when a data access operation is performed on a memory device (e.g., a ratio of the number of erroneous bits to the number of all data bits stored in a certain portion, such as a specified block, of the memory device). In these memory devices, sweep reads can be performed to create RBER/log likelihood ratio (LLR) profiles for error correction code (ECC) and select the most efficient profile. Such calibrations can be performed to accurately predict where valleys are located between $V_t$ distributions for purposes of accurately reading data from the memory cells.

Various workloads experienced by the memory devices can cause data to be written to nonconsecutive wordlines and nonconsecutive blocks. This could result in some portion of the wordlines in a block being coupled to cells that are programmed (such wordlines referred to herein as "programmed") and another portion of the wordlines in a block being coupled to cells that are coupled to cells that are not programmed (i.e., in an erased state) (such wordlines referred to herein as "unprogrammed" or "not programmed"). A block all the wordlines of which are programmed wordlines, is a block that is considered to be in a fully programmed state and can be referred to as a completely programmed block or a complete block. Analogously, a block containing some programmed wordlines and some unprogrammed wordlines is considered to be a block that is in a partially programmed state and can be referred to as a partially programmed block or a partial block.

In many cases, the operation of such memory devices can generate an undesirable effect on a physical block of memory cells called a "back-pattern effect" that causes change in the perceived $V_t$ across the memory cells (e.g., by causing each $V_t$ level to be sensed at lower voltages). The back-pattern effect is primarily exhibited during reads of memory cells in partial blocks and most strongly experienced in scenarios with nearly empty partial blocks (i.e., where the majority of the wordlines are unprogrammed wordlines). The back-pattern effect can be understood, therefore, as an overdrive of current within a bitline of a memory cell array in a block. This overdrive of current is caused by the pass-through voltage ($V_{pass}$) applied to unselected WLs of memory cells of the array that are not programmed. Although initially this $V_{pass}$ is applied to all WLs in a region of a memory device, during a read operation it generally remains applied to unselected WLs to ensure the memory cells coupled to those WLs remain conducting (i.e., turned on) along the BL being used. This back-pattern effect can impact all $V_t$ distributions of the memory array and can, in many cases, not be compensated for via the previously mentioned calibration techniques that aim to compensate for temporal $V_t$ distribution shifts.

Because of the lower perceived $V_t$ sensed for some cells when reading partial blocks that experience this back-pattern effect, the rate at which error handling operations (e.g., remedial ECC operations) are triggered (referred to herein as a "trigger rate") by the memory device during the read operations is high, even for memory devices in which calibration techniques are employed to address the temporal $V_t$ shifts. Accordingly, read trigger rate refers to a measure (e.g., a count, or frequency) of read operations that trigger additional read error handling operations (e.g., remedial ECC operations), caused by a high raw bit error rate (RBER) encountered during the read operation. A high read trigger rate can be observed in partial blocks regardless of the duration of time elapsed between programming a set of cells and the read operation being performed on those cells, as well as regardless of whether or not programming was performed at a different temperature than the later read operation. Thus, the read trigger rate can correspond to the probability that an initial attempt to retrieve data fails (e.g., when a code word fails hard decode) and therefore directly correlates with system performance and quality of service (QoS). For example, if a set of data (e.g., codeword) fails a hard bit read operation, an error recovery flow will be triggered and increase the latency of the data being retrieved. This delay negatively impacts QoS and uses additional computing resources. This effect and its negative impacts on memory devices are evident in storage applications for mobile, embedded storage, storage (consumer, client, datacenter devices) or external customers, all of which involve the creation and use of partial block. Furthermore, this back-pattern effect can be expected to worsen as the number of WLs per block and/or per sub-block increases.

Aspects of the present disclosure address the above and other deficiencies by compensating for the back-pattern effect by offsetting the voltage used during read operations. The various embodiments described herein, can account for the perceived $V_t$ that is caused by the back-pattern effect to be sensed at a lower value for some cells when a block is being read. The difference between the perceived $V_t$ and the actual $V_t$ can be compensated for by offsetting a voltage. In some embodiments the voltage offset can be determined from information that indicates whether the cells being read are on a block that is a complete block or a partial block. The information can also indicate a portion of the block that is programmed. Accordingly, this compensation can generally depend on determining a value of a chosen metric reflecting the ratio of programmed wordlines of the block. The values of metric can be mapped to respective voltage offsets that would compensate for the back-pattern effect when applied in read operations performed on the block.

In an illustrative example, a memory sub-system controller can receive a request for some data to be retrieved (i.e., a read request). The read request can specify a block on a memory device in the memory-sub system. In response, before performing the read operation to retrieve the requested data, the controller can retrieve a value of a metric that reflects (i.e., is derived by applying a known mathematical transformation to) the number of programmed wordlines (i.e., the wordlines that are connected to programmed memory cells) of the block specified by the read request. Such a metric can be, e.g., the number of programmed wordlines, a predefined linear function of the number of programmed wordlines, or the ratio of the number of programmed wordlines to the number of total wordlines.

Consequently, the metric can be used to identify a corresponding read voltage offset that can be applied to compensate for the back-pattern effect on the block. The read voltage offset can be obtained, e.g., from a metadata structure that includes a plurality of records, such that each record maps each value of the metric to a corresponding read voltage offset. For example, the metadata structure can be a table created by observing the trigger rate on blocks with respective different numbers of programmed wordlines to determine corresponding read voltage offsets that minimize the trigger rate (i.e., the rate of error handling operations being triggered when reads are performed). Then the memory-sub-system can apply the read voltage offset in a read operation performed on the memory cells of the block.

Advantages of the present disclosure include reducing the read trigger rates associated with partial blocks on memory devices, thus reducing the latency of memory access operations performed by the memory device. More specifically, since error handling flows, such as ECC operations, increase the time elapsed for data to be retrieved and provided to the requesting host system and consume computing resources, reducing the read trigger rate can decrease the latency, increase the availability of resources for performing other operations. This reduction in read trigger rates improves the quality of service (QoS) that users will experience in accessing data during read operations. Thus, as explained in more detail below, the embodiments described in this disclosure improve the performance of memory devices through partial block read compensation. Other advantages will be apparent based on the additional details provided herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MHLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a memory access manager 113 that can perform partial block read compensation on memory device 130 to account for the impact of the back-pattern effect. In several embodiments, the memory access manager 113 can receive and respond to data access requests from host system 120 and manage compensation by controlling the voltages that are applied during read operations on memory device 130. In some embodiments, the memory sub-system controller 115 includes at least a portion of the memory access manager 113. In some embodiments, the memory access manager 113 is part of the host system 110, an application, or an operating system. In other embodiments, local media controller 135 includes at least a portion of the memory access manager 113 and is configured to perform the functionality described herein.

Memory access manager 113 can perform various actions such as handling the interactions of memory sub-system controller 115 with the memory devices 130, 140 of memory sub-system 110. For example, in some embodiments, the memory access manager 113 can transmit, to memory device 130 memory access commands that correspond to requests received by memory sub-system 110 from host system 120, such as program commands, read commands, and/or other commands. Besides, the memory access manager 113 can receive data from memory devices 130, 140, such as data retrieved in response to a read command or a confirmation that a write/program command was completed successfully.

In some embodiments, the memory sub-system controller 115 can include a processor 117 (processing device) configured to execute instructions stored in local memory 119 for performing the operations described herein. In other embodiments, the operations described herein are performed by the memory access manager 113. In yet other embodiments, local media controller 135 can perform the operations described herein. In at least one embodiment, memory device 130 can include a memory access manager configured to carry out memory access operations (e.g., operations performed in response to memory access commands received from processor 117 or from the memory access manager 113). In some embodiments, local media controller 135 can include at least a portion of memory access manager 113 and can be configured to perform the functionality described herein. In some of these embodiments, the memory access manager 113 can be implemented on memory device 130 using firmware, hardware components, or a combination of firmware and hardware components. In an illustrative example, the memory access manager 113 can receive, from a requesting component, such as processor 117, a request to read a data page of the memory device 130, and respond to it by performing the requested read operation. For the purposes of this disclosure, a read operation can include a series of read strobes (also referred to as pulses), such that each strobe applies a specific read voltage level to a particular wordline of a memory device 130. In the read operation, each strobe can be used to compare the estimated threshold voltages $V_t$ of a set of memory cells to one or more read voltage levels corresponding to the expected positions of the voltage distributions of the memory cells.

Accordingly, in some embodiments, the memory access manager 113 can receive a read request that specifies a block. Having received the read request, the memory access manager 113 can retrieve a value of a chosen metric reflective of the number of wordlines of the block that are connected to programmed memory cells (i.e., programmed wordlines). In some embodiments, the metric can be an absolute or relative number of programmed wordlines or of unprogrammed wordlines. In other embodiments, the metric can be a percentage or ratio of programmed wordlines to total wordlines, programmed wordlines to unprogrammed wordlines, or unprogrammed wordlines to total wordlines. In yet other embodiments, the metric can be an indication of the last wordline that was programmed (e.g., on a block) from which an inference regarding the number of programmed wordlines and the remaining unprogrammed wordlines can be made. The memory access manager 113 can determine whether the block that was specified in the read request is in a partially programmed state (i.e., whether the block is a partial block) if the retrieved value of the metric reflects that fewer than a threshold number (e.g., all) of the wordlines on the block are unprogrammed. In some embodiments, the memory access manager 113 can identify a read voltage offset that corresponds to the value of the metric. Then, the memory access manager 113 can perform, using the read voltage offset, a read operation responsive to the read request. More specifically, the memory access manager 113 can apply the read voltage offset in a read operation performed on the memory cells of the block.

In some embodiments, the read request can be received the memory access manager 113 from host system 120 or from another component of memory sub-system 110. The read request can specify a logical address that can correspond to a physical address on a block of the memory device 130 containing the requested data. Accordingly, the read request can contain an indication specifying the block from which data is requested. When the memory access manager 113 receives the request, in response, the memory access manager 113 can retrieve a value of the metric reflective of the number of programmed wordlines of the block. In some embodiments, to retrieve the value of the metric, the memory access manager 113 can reference a data structure containing information that associates each block with a corresponding metric value reflecting the portion of the wordlines of the block that are programmed wordline. For example, the data structure can contain entries associating particular blocks with respective corresponding values of the metric. In some embodiments, the data structure can be a metadata structure that includes a plurality of records, such that each record maps each value of the metric to a corresponding read voltage offset. The data structure can be stored in local memory 119, memory device 130, memory device 140, or in another location. In some embodiments, the memory access manager 113 can identify, in a data structure, the metric value that is associated with the block specified by the read request.

Then, in order to determine whether the block is a partial block, the memory access manager 113 can determine whether at least a predefined threshold number of wordlines of the block is connected to a corresponding set of erased memory cells. For example, the memory access manager 113 can determine whether at least one wordline is connected to a set of erased cells (i.e., determine whether there is at least one unprogrammed wordline in the specified block). Further, the memory access manager 113 can identify in a data structure on a memory device (e.g., in the local memory 119, memory device 130, memory device 140, or in another location), a read voltage offset that corresponds to the value of the metric (e.g., the metric value that the memory access manager 113 previously retrieved). To identify the read voltage offset, the memory access manager 113 can reference a data structure that includes a record (e.g., on the memory device) that contains an association between the value of the metric and the corresponding read voltage offset. More specifically, the memory access manager 113 can identify, in a metadata structure, a record associating the value of a metric and the corresponding read voltage offset. In some embodiments, the metadata structure can contain information that associates each block of the plurality of blocks with a corresponding value of the metric. Having identified the read voltage offset, the memory access manager 113 can apply the read voltage offset in a read operation performed on the memory cells of the block. In some embodiments, the memory access manager 113 can issue (e.g., to the memory device 130) a read command that includes the read voltage offset. Implementations of the various aspects and principles of the operation of the memory access manager 113 mentioned above are described in more detail below with reference to FIGS. 2A-2C. Further details with regards to these generally described operations of the memory access manager 113 are explained below with reference to FIGS. 4-5.

Figure 2A:
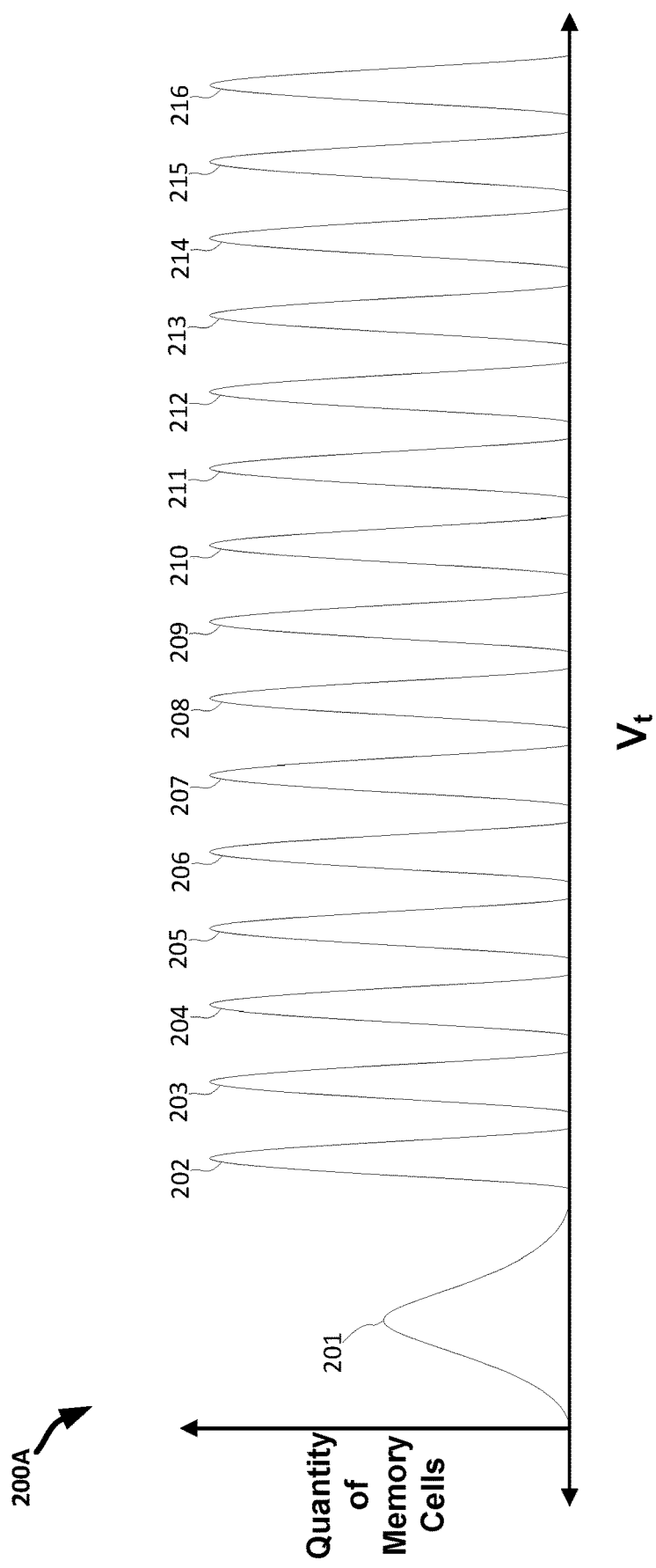
FIG. 2A is a graph of an example set of threshold voltage distributions of multiple memory cells of a memory array in a memory device in accordance with some embodiments of the present disclosure.

FIG. 2A is a graph 200A of an example set of threshold voltage distributions of multiple memory cells of a memory array in a memory device in accordance with some embodiments of the present disclosure. In some embodiments, memory cells on a block of a memory device (e.g., memory device 130 of FIG. 1) can have different $V_t$ values an aggregate representation of which for a set of these memory cells can be shown with plots on a graph such as graph 200A. For example, a set of $V_t$ ranges and their distributions for a group of sixteen-level memory cells, e.g., QLC memory cells is depicted in FIG. 2A. In some embodiments, each of these memory cells can be programmed to a $V_t$ that is within one of sixteen different threshold voltage ranges 201-216. Each of the different $V_t$ ranges can be used to represent a distinct programming state that corresponds to a particular pattern of four bits. In some embodiments, the threshold voltage range 201 can have a greater width than the remaining threshold voltage ranges 202-216. This can be caused by the memory cells initially all being placed in the programming state corresponding to the threshold voltage range 201, after which some subsets of those memory cells can be subsequently programmed to have threshold voltages in one of the threshold voltages ranges 202-216. Because write (i.e., programming) operations can be more precisely controlled than erase operations, these threshold voltage ranges 202-216 can have more narrow distributions.

In some embodiments, the threshold voltage ranges 201, 202, 203, 204, 205, 206, 207, 208, 209, 210, 211, 212, 213, 214, 215, and 216 can each represent a respective programming state (e.g., represent L0, L1, L2, L3, L4, L5, L6, L7, L8, L9, L10, L11, L12, L13, L14 and L15 respectively). For example, if the $V_t$ of a memory cell is within the first of the sixteen threshold voltage ranges 201, the memory cell in this case can be said to be in a programming state L0 corresponding to the memory cell storing a 4-bit logical value of '1111' (this can be referred to as the erased state of the memory cell). Thus, if the threshold voltage is within the second of the sixteen threshold voltage ranges 202, the memory cell in this case can be said to be in a programming state L1 corresponding to the memory cell storing a 4-bit logical value '0111'. If the threshold voltage is within the third of the sixteen threshold voltage ranges 203, the memory cell in this case can be storing a programming state L2 having a 4-bit logical value '0011,' and so on. In some embodiments, a correspondence table such as Table 1 can provide a correspondence between the states of the memory cells and their corresponding logical values. Other associations of programming states to corresponding logical data values are envisioned. For the purposes of this disclosure, memory cells that are in the lowest state (e.g., the erased state or L0 data state) can be referred to as unprogrammed, erased, or set to the lowest programming state.

TABLE 1

| Programming State | Logical Programming Value | Programming State | Logical Data Value |
|---|---|---|---|
| L0 | 1111 | L8 | 1100 |
| L1 | 0111 | L9 | 0100 |
| L2 | 0011 | L10 | 0000 |
| L3 | 1011 | L11 | 1000 |
| L4 | 1001 | L12 | 1010 |
| L5 | 0001 | L13 | 0010 |
| L6 | 0101 | L14 | 0110 |
| L7 | 1101 | L15 | 1110 |

Notably, the operations described herein involve distinguishing one state of a memory cell from another and determining in which of the states a memory cell is in. This determination can be made by focusing the discussion on states represented by two adjacent $V_t$ distributions as explained in more detail with reference to FIG. 2B.

Figure 2B:
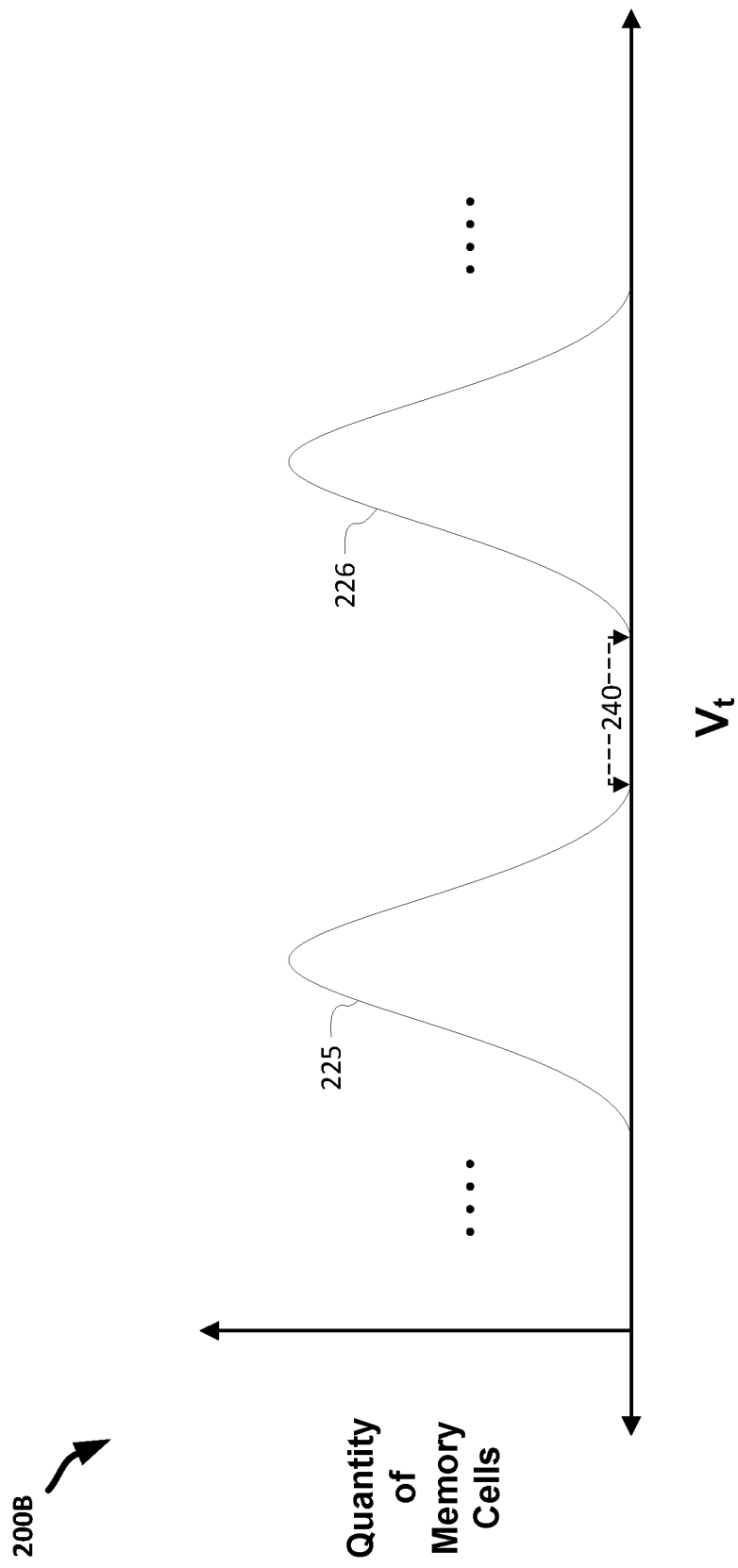
FIG. 2B is a graph of two example threshold voltage distributions of multiple memory cells of a memory array in a memory device in accordance with some embodiments of the present disclosure.

FIG. 2B is a graph 200B of two example threshold voltage distributions of multiple memory cells of a memory array in a memory device in accordance with some embodiments of the present disclosure. Consider the depiction FIG. 2B of an example $V_t$ distribution 225-226 to be analogous to a pair of adjacent $V_t$ distributions from graph 200A of FIG. 2A. For example, the $V_t$ distributions 225-226 of FIG. 2B can represent some portion of the distributions for threshold voltage ranges 201-216 of FIG. 2A after the completion of a write (i.e., programming) operation for a group of memory cells. As seen in FIG. 2B, adjacent threshold voltage distributions 225-226 can be separated by some margin 240 (e.g., empty voltage level space) at the end of a programming operation. Applying a read voltage (i.e., sensing voltage) within the margin 240 to the control gates of the group of memory cells can be used to distinguish between the memory cells of the threshold voltage distribution 225 (and any lower threshold voltage distribution) and the memory cells of the threshold voltage distribution 226 (and any higher threshold voltage distribution).

Due to a phenomenon called charge loss, which can include quick charge loss (QCL) and slow charge loss (SCL), the threshold voltage of a memory cell can change over time as the electric charge contained in the cell degrades. As previously discussed, this change results in a shift of the $V_t$ distributions over time and is referred to as a temporal $V_t$ shift (since the degrading electric charge causes the voltage distributions to shift along the voltage axis towards lower voltage levels and causes the margin 240 to narrow over time). Further, during the operation of a memory device, the QCL can be caused by the threshold voltage changing rapidly at first (immediately after the memory cell was programmed), after which the effect of SCL becomes more evident as the $V_t$ shift slows down in an approximately logarithmic linear fashion with respect to the time elapsed since the cell was programmed. In various embodiments, this temporal $V_t$ shift, if left unadjusted, reduces the read window margin 240 between the threshold voltage distributions 225-226 over time, and can cause these threshold voltage distributions to overlap, making it more difficult to distinguish between cells whose actual $V_t$ is within the range of one of the two adjacent $V_t$ distributions 225-226. Accordingly, failure to mitigate the temporal $V_t$ shift caused by the SLC and QLC can result in the increased bit error rate in read operations. Further, failing to address or account for the $V_t$ shift across all $V_t$ distributions caused by the back-pattern effect discussed previously can cause increases in read errors, resulting in a high read trigger rate, which in turn negatively impacts overall latency, throughput, and QoS of a memory device. The numbers of distributions, programming levels, and logical values in the illustrative examples of FIGS. 2A-2B are chosen for illustrative purposes and are not to be interpreted as limiting, other embodiments can use various other numbers of distributions, associated programming levels, and corresponding logical values can be used in the various embodiments disclosed herein.

Figure 2C:
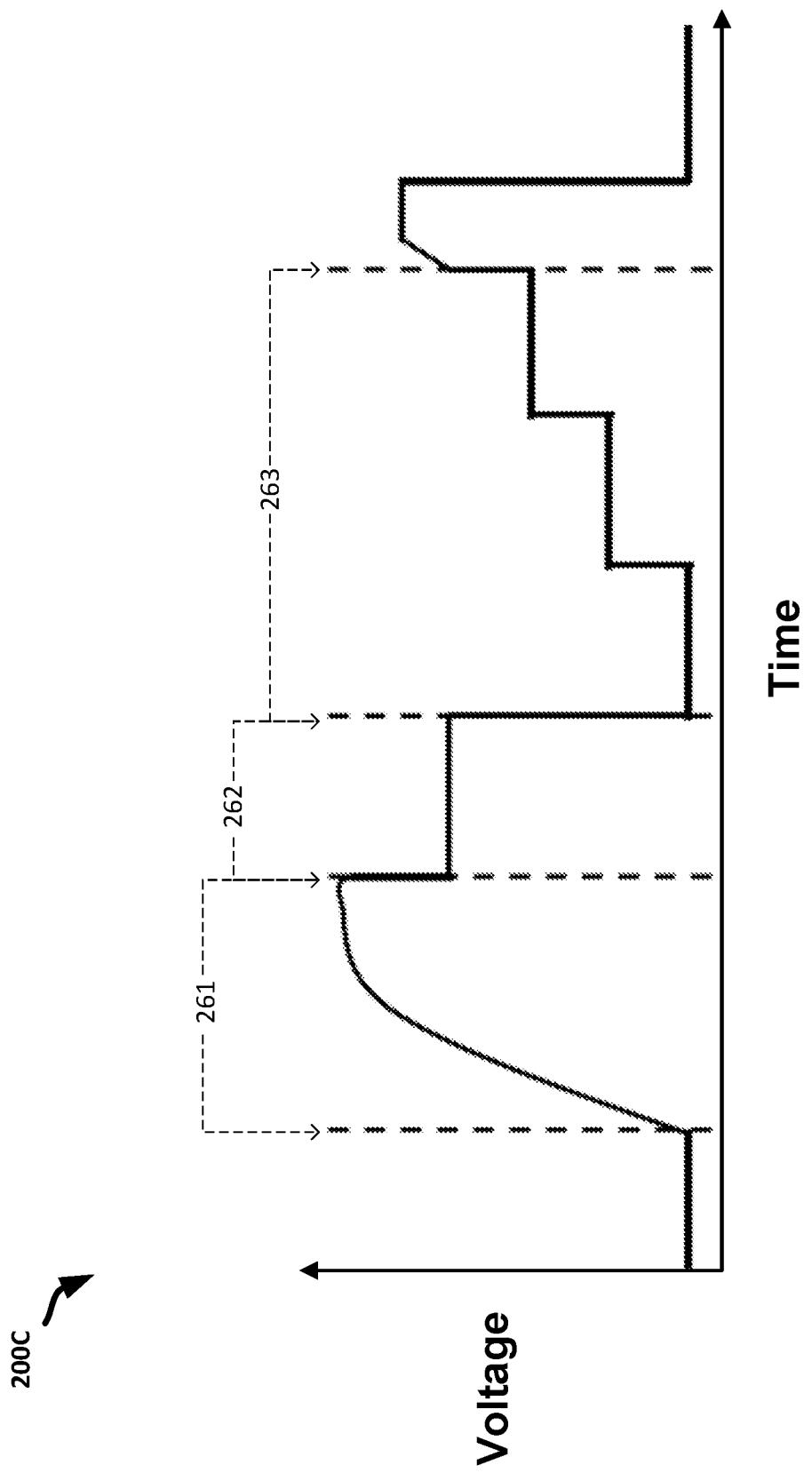
FIG. 2C is a graph of voltage levels applied during consecutive phases of an example read operation in accordance with some embodiments of the present disclosure.

FIG. 2C depicts a graph 200C of voltage levels applied during consecutive phases of an example read operation in accordance with some embodiments of the present disclosure. The graph 200C shows three distinct phases in the example read operation. For example, in some embodiments the read operation can include a first phase 261 that can be referred to as a ramping phase, a second phase 262 that can be referred to as a calibration phase, and a third phase 263 that can be referred to as a read offset phase.

In some embodiments, during a first phase 261, a pass voltage (or "$V_{pass}$") can be applied to particular the wordlines (WLs) of specified bitlines (BLs) of an array of memory cells (e.g., an array of memory cells in memory device 130 of FIG. 1). In various embodiments, for a group of cells programmed to a random logical level (i.e., potentially including all cells being programmed to different levels or to the same logical level), a dynamic (i.e., ramping) $V_{pass}$ applied to the respective WLs of the cells until the $V_{pass}$ rises to a level that causes a current to pass along the BL to which the cells are connected. Reaching a sufficiently high $V_{pass}$ level that causes current to pass along a specified BL can be referred to as tripping the BL current, tripping the BL, or simply tripping. Accordingly, in some embodiments, the dynamic $V_{pass}$ applied to the respective WLs of the cells can trip the BL current (i.e., rises to a level sufficiently high to permit a current to pass along a specified BL) at different values depending on the number of programmed WLs of the block where the cells are located (i.e., the number of WLs on the block that are coupled with memory cells that have been programmed).

More specifically, as the $V_{pass}$ increases on unselected WLs in the first phase 261 of the operation depicted in FIG. 2C, due to excess (i.e., overdrive of current) passing into the BL, the potential difference experienced along the BL increases. In a fully programmed block, due to higher programmed threshold voltages ($V_t$) across programmed memory cells, the BL current ($I_{BL}$) for a given $V_{pass}$ can be several times lower than the current on a WL. In a partially programmed block, since some of the memory cells are in an erased state (for which the $V_t$ of these memory cells is lower), the BL current for a particular $V_{pass}$ is higher due to some portion of the current passing from the WL into the VL. Accordingly, in a partial block that is just starting to be programmed (i.e., containing at most a threshold number of programmed WLs), the BL current for a particular $V_{pass}$ can be significantly higher than the BL current for the same $V_{pass}$ in a fully programmed block. Thus, the differences in $V_{pass}$ tripping of BL current can be detected by sensing the current along BLs within different partial blocks and complete blocks the memory device 130. In a fully programmed block, the $V_{pass}$ may need to get to a higher level to trip the BL current. Conversely, in a partial block, the $V_{pass}$ may not need to get very high to achieve the tripping of the BL current. Therefore, $V_{pass}$ can be said to trip at a higher level for cells programmed to the same level on fully programmed blocks than for those on partially programmed blocks. For example, the difference caused by this phenomenon can be seen in FIGS. 3A-3B.

In some embodiments, the memory access manager 113 or the memory sub system controller 115 of the memory sub-system 110 can track and record the number of programmed WLs of a block. This tracking and record can be presented as a raw number value or as a ratio of the number of programmed WLs of the block. In one embodiment, the memory access manager 113 can retrieve the value reflective of the number of programmed WLs on the block. The memory access manager 113 generates a read command indicating a selected wordline that is to be read and transmit that command along with the value reflective of the number of programmed WLs on the block. The memory device 130 can then receive the read command that includes the indication of the selected wordline and value reflective of the number of programmed WLs on the specified block.

In various embodiments, once the number (or ratio) of programmed WLs on the specified blocks has been determined, the memory access manager 113 can adjust the read voltage to be applied to the memory cells during the third phase 263 of the read operation by applying a read voltage offset to the read voltage. The memory access manager 113 can then apply the adjusted read voltage to the selected WL (e.g., to perform sensing at the memory cell(s) coupled with the selected wordline). The graph 200C of FIG. 2C illustrates several read pulses applied indicating that the read voltage offset can be applied to one or more of the read voltages employed in the third phase 263.

More specifically, in some embodiments, the memory access manager 113 can determine the number of programmed WLs by detecting a $V_{pass}$ trip point ($V_{passR}$) value associated with a $V_{pass}$ applied to WLs of the specified block during a read operation. In these embodiments, adjusting the read voltage level (i.e., applying the determined offset to the read voltage) can include associating a particular $V_{passR}$ value with a corresponding number range of programmed WLs. Consequently, the memory access manager 113 can identify, in a record on the memory device, a read voltage offset corresponding to the number range of programmed WLs. For example, the memory access manager 113 can reference a data structure containing the record to determine a read voltage offset corresponding to the specific range of WLs and apply the voltage offset to an existing read voltage level to determine the adjusted read voltage. The data structure can be a table that can be stored in local memory 119, in memory device 130, in memory device 140, or in another location.

In some embodiments, the second phase 262 of the read operation can also include additional calibration of the read voltage (i.e., "read calibration") for cells having particular $V_t$ distributions. The term read calibration can refer to the application of a series of read voltages to determine the voltage that minimizes the number of incorrectly sensed memory cell states (i.e., minimizes the number of bit errors). For example, to adjust the read voltage, the memory access manager 113 can perform a first read calibration to determine a first voltage offset corresponding to the number of programmed wordlines in a partial block. The memory access manager 113 can further perform a second read calibration to determine a second voltage offset that compensates for a temporal $V_t$ shift associated with a selected WL. The memory access manager 113 can further combine the second voltage offset (that compensates for temporal $V_t$ distribution shift) and the first voltage offset (that compensates for the back-pattern effect based on the number of programmed WLs) to determine the total voltage offset. The memory access manager 113 can then adjust, using the total voltage offset, an existing read voltage (i.e., by applying one or more of the first and second offsets to the read voltage). The memory access manager 113 can then issue a read command utilizing the total voltage offset (including the first and/or second voltage offset) to the memory device 130. In some embodiments, the memory access manager 113 can apply the adjusted read level voltage in a read operation performed on the memory cells of the block.

In various embodiments, once the adjusted read voltage is determined, the memory access manager 113 can perform a parallel auto read calibration (pARC) that can be utilized to locate the read window margins within the valleys between $V_t$ distributions of a group of memory cells coupled to the selected WL. In this manner, after determining the voltage offset(s) that are to be applied to the read voltage, a part of the read operation can include performing a pARC-based calibration.

In some embodiments, the calibration that generates the second voltage offset (that compensates for temporal $V_t$ distribution shift), to compensate for temporal $V_t$ shift of the selected memory cells, can be obtained using a failed byte count (CFbyte) or a failed bit count (CFbit) for a group of memory cells. The failed byte count can reflect (e.g., can be equal to or be derived by a known transformation from) the number of bytes in the sensed data (i.e., number of cells in the group of cells) that have at least one BL that is not conducting current (e.g., due to the $V_t$ of associated memory cells being above a particular read $V_t$). The failed bit count can reflect (e.g., can be equal to or can be derived by a known transformation from) the number of BLs that are not conducting current for the group of cells containing in the sensed data (e.g., due to the $V_t$ of associated memory cells being above a particular read $V_t$). The memory access manager 113 can determine a metadata value that reflects a read voltage of a $V_t$ distribution of a subset of a group of memory cells, where the metadata value is either the digital CFbyte, the CFbit, or a combination of the digital CFbyte and the CFbit.

Accordingly, once the CFbyte or CFbit value is determined, that value can be used to find, for example in a look up table, a corresponding read offset that can be used as the second voltage offset in the read operation. In some embodiments, a higher number of bytes/bits that are above the particular read $V_t$ can indicate a smaller temporal $V_t$ shift and thus the second voltage offset could be smaller. In contrast, a lower number of bytes/bits that are above the particular read $V_t$ can indicate a higher temporal $V_t$ shift (e.g., more charge loss) and thus the second voltage offset (that compensates for temporal $V_t$ distribution shift) could be higher to provide compensation for temporal $V_t$ shift.

As noted, in some embodiments, the memory access manager 113 can retrieve the value of a chosen metric that reflects the number of wordlines in a block that are connected to memory cells that have been programmed. Upon determining that the block contains at least a threshold number of unprogrammed WL and is therefore a partial block, the memory access manager 113 can determine a voltage offset corresponding to the number of programmed wordlines. In some embodiments, the memory access manager 113 can identify, in a record on a memory device (e.g., in the local memory 119, memory device 130, memory device 140, or in another location), a read voltage offset that corresponds to the value of the metric (e.g., the metric value that memory access manager 113 previously retrieved). In some embodiments, the voltage offset is an optimal read voltage offset intended to compensate for the partial block condition of the memory array (i.e., compensate for the back-pattern effect caused by the specific number of unprogrammed WLs in the block). To identify the read voltage offset, in some embodiments, the memory access manager 113 can reference a data structure (e.g., stored on the memory device 130) that includes multiple records, such that each record maps a value of the metric to the corresponding read voltage offset. In some embodiments, the data structure can be a metadata structure (e.g., stored on the local memory 119 or the memory device 130), and the memory access manager 113 can retrieve, from the metadata structure, the read volta offset that corresponds to the value of the metric. The data structure can be a table such as the example Table 2 shown below that associates ranges of amounts of programmed WL with corresponding read voltage offsets.

TABLE 2

| Range Index | WL# | Read Voltage Offset |
|---|---|---|
| $1^{st}$ | WL2-14 | $V_1$ mV |
| $2^{nd}$ | WL15-31 | $V_2$ mV |
| $3^{rd}$ | WL32-61 | $V_3$ mV |
| $4^{th}$ | WL62-90 | $V_4$ mV |
| $5^{th}$ | WL91-140 | $V_5$ mV |
| $6^{th}$ | WL141-180 | $V_6$ mV |

Accordingly, in some embodiments, the memory access manager 113 can determine the voltage offset by accessing such a data structure in which ranges of amounts of programmed WLs in the specified block are indexed against different corresponding voltage offsets. In other embodiments, alternative data structures may be used. Thus, for example, if a block contains 40 programmed wordlines, because this would mean that the block is in the range of 32-61 WL in the table. Accordingly, a corresponding offset of $V_3$ mV could be identified in the table and thereafter applied by memory access manager 113.

Further, to determine the read level voltage, memory access manager 113 can perform the above-mentioned additional read voltage calibration. To do so, the memory access manager 113 can perform one read calibration to determine the first voltage offset corresponding to the number of programmed wordlines on the block and perform another read to determine the second voltage offset that compensates for a temporal $V_t$ shift associated with the selected wordline. These operations can further include combining the first voltage offset and the second voltage offset to determine a total voltage offset. The operations can further include adjusting, using the total voltage offset, an existing read level voltage for the selected memory cell to determine an adjusted read level voltage. Having identified the read voltage offset(s), the memory access manager 113 can directly apply the read voltage offset(s) in a read operation performed on the memory cells of the block. In some embodiments, the memory access manager 113 can issue (e.g., to the memory device 130) a read command that includes the read voltage offset. For example, memory access manager 113 can generate the read command to include the read level voltage that incorporates the voltage offset (and optionally also to combine additional voltage offsets into a total voltage offset inserted into the read command) and then transmit the command to the memory device 130. The result of these operations can be understood with reference to FIGS. 3A-3B.

FIG. 3A depicts a graph of a plot 300A, illustrating the relationship between the number of programmed wordlines (WLs) with corresponding pass-through voltages ($V_{passR}$) required to trip the bitline current, in accordance with some embodiments of the present disclosure.

In some embodiments, for a particular array of memory cells, $V_{passR}$ can remain the same until a particular number of WLs are programmed on the block. After that, $V_{passR}$ increases rapidly with an increasing number of programmed wordlines embodiment. As illustrated, the initial 20 WLs that are programmed do not change the relatively low $V_{passR}$ value that causes current to flow on the BL associated with respective cells. A $V_{passR}$ is the voltage applied to the WL above which the memory cell activates and allows current to pass along the BL to which it is connected.

As additional memory cells are programmed, the $V_{passR}$ values increase with the increasing number of programmed WLs, as illustrated in the graph of FIG. 3A. Thus, the memory access manager 113, or the local media controller 135 can correlate the pass voltage trip point with various ranges in terms of the number of programmed WLs to create or store the aforementioned data structures. The horizontal dashed lines mark the respective endpoints of each of the example ranges 361-366 of amounts of programmed WLs. In various embodiments, the first range 361 can include 2-14 programmed WLs, the second range 362 can include 15-31 programmed WLs, the third range 363 can include 32-61 programmed WLs, the fourth range 364 can include 62-90 programmed WLs, the fifth range 365 can include 91-140 programmed WLs, the sixth range 366 can include 141-180 programmed WLs, and so forth with increasing numbers of programmed WLs on the block. The ranges can be designed to be narrower if initially a low number of WLs on the block are programmed, and wider in as more WLs on the block are programmed. More fine-grained or less-granular ranges are also envisioned in the different embodiments disclosed herein, which can depend on the workload and architecture of memory device 130.

FIG. 3B depicts a graph of a plot 300B, resulting from partial block voltage level compensation, illustrating the relationship between the number of programmed wordlines (WLs) with corresponding pass-through voltages ($V_{passR}$) required to trip bitline current, in accordance with some embodiments of the present disclosure. The depicted graph shows that partial block read voltage compensation in which the $V_{passR}$ is more distinguishable and differentiated for different respective amount of programmed WLs on a block according to an embodiment. As can be observed, compared with plot 300A, plot 300B more distinctly shows different $V_{passR}$ corresponding to each respective amount of programmed WLs in the first three ranges 361-363 along a more gradual curve of pass voltage trip points.

Figure 4:
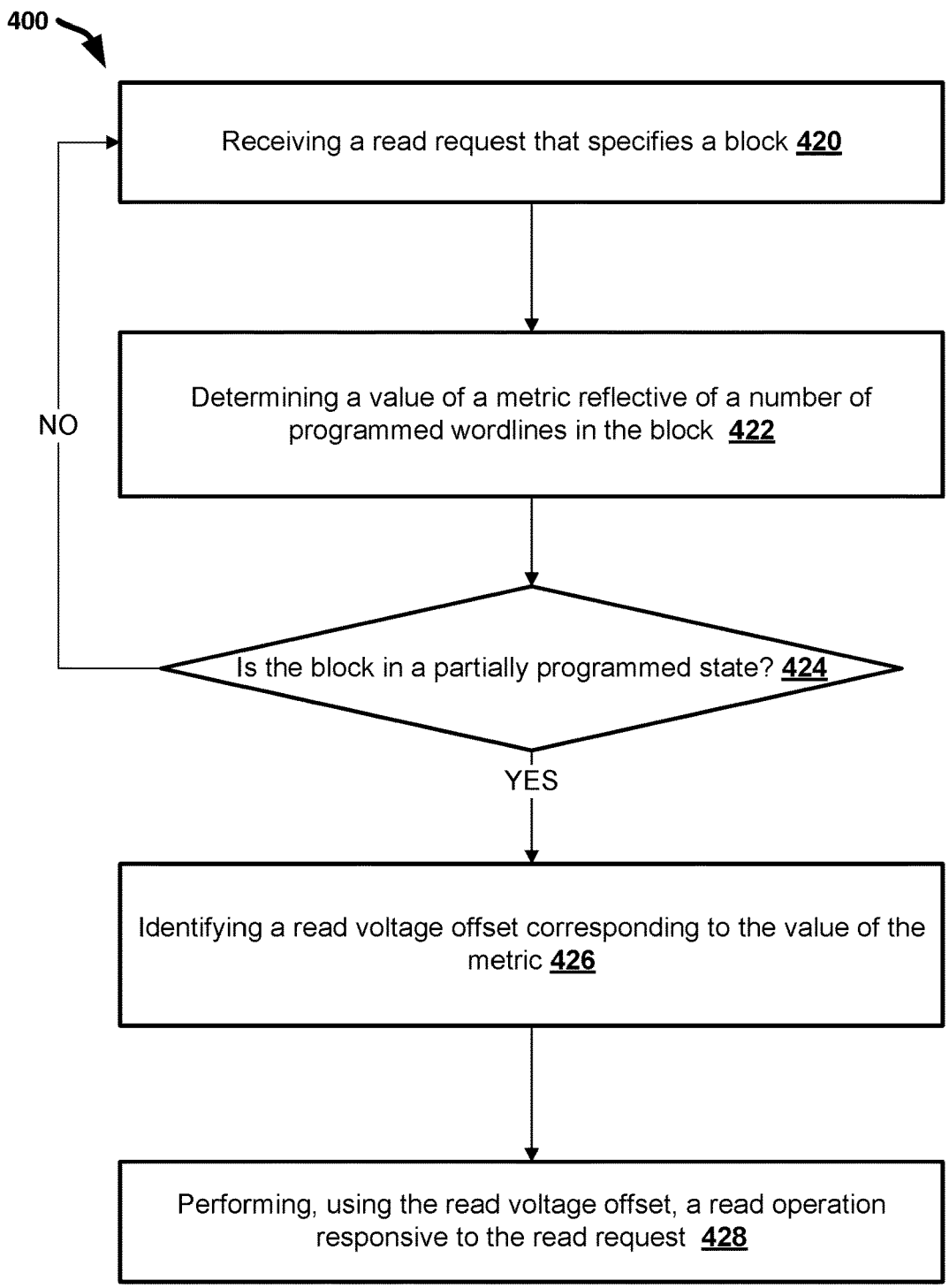
FIG. 4 is a flow diagram of an example method for performing partial block read compensation on memory devices in accordance with some embodiments of the present disclosure.

FIG. 4 is flow diagram of an example method 400 for performing partial block read compensation on memory devices in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the memory access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments of the present disclosure, at operation 420, the processing logic can receive a read request that specifies a block on a memory device (e.g., memory device 130 of FIG. 1). At operation 422, the processing logic can determine a value (e.g., by retrieving the value from a metadata structure) of a metric reflective of a number of programmed wordlines in the block. Having received the read request, the processing logic can, at operation 424, therefore, determine whether the block that was specified in the read request is in a partially programmed state (i.e., whether the block is a partial block). For example, if the retrieved value of the metric reflects that fewer than a threshold number (e.g., all) of the wordlines on the block are unprogrammed, the processing logic can determine, at operation 424, that the block is a partial block. In some embodiments, at block 426 the processing logic can identify a read voltage offset that corresponds to the value of the metric. Accordingly, processing logic can, at operation 428 perform, using the read voltage offset, a read operation responsive to the read request. For example, the processing logic can apply the read voltage offset in a read operation performed on the memory cells of the block. Additional details of partial block read compensation on memory devices are provided below with reference to FIG. 5.

Figure 5:
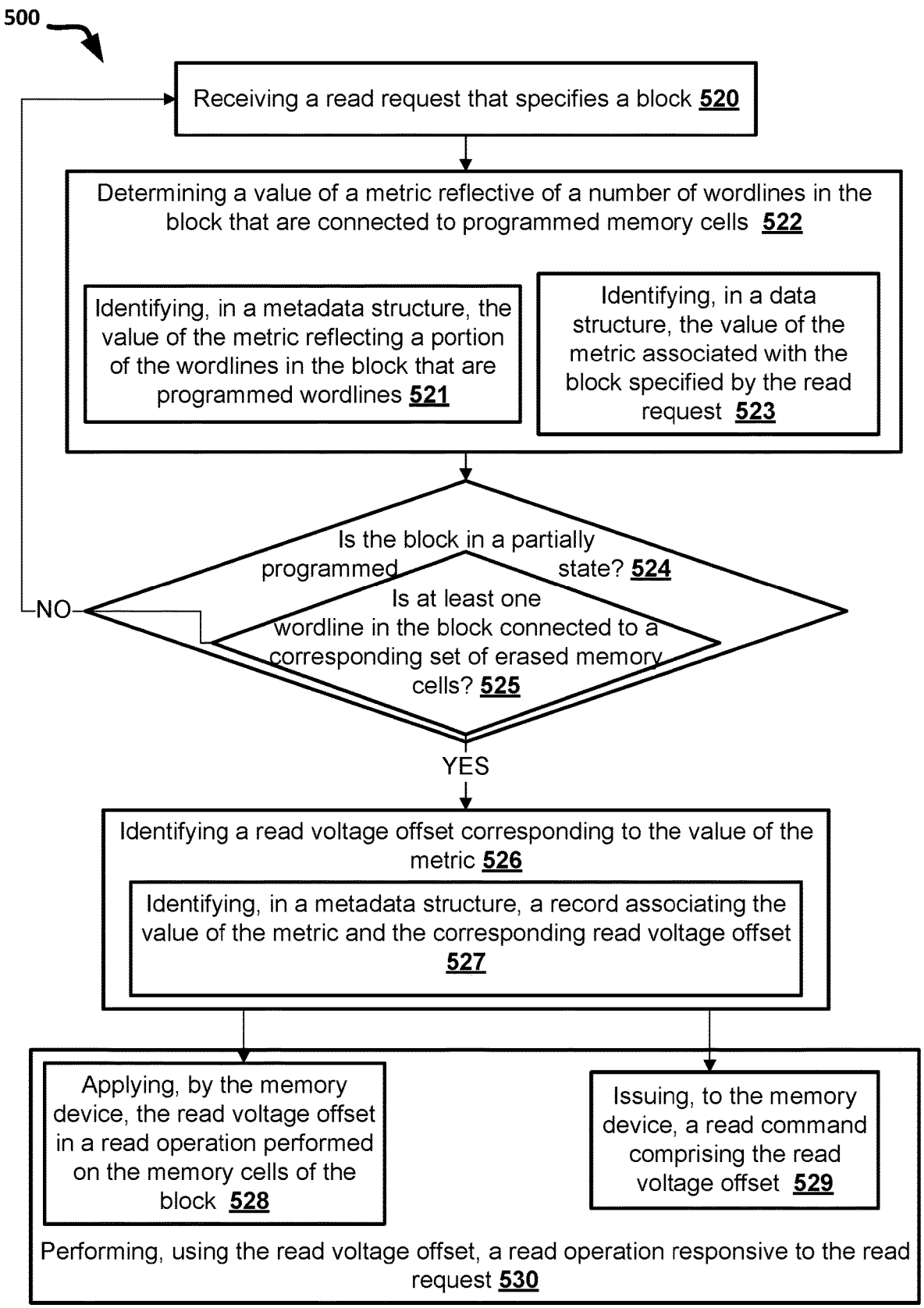
FIG. 5 is a flow diagram of another example method for performing partial block read compensation in accordance with some embodiments of the present disclosure.

FIG. 5 is a flow diagram of another example method 500 for performing partial block read compensation in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 500 can be performed together with or instead of operations of example method 400. In some embodiments, at operation 520, the processing logic can receive (e.g., from host system 120 or from another component of memory sub-system 110 of FIG. 1) a read request that specifies a particular block on a memory device. For example, the read request can contain an indication specifying the block from which data is requested.

Thus, in some embodiments, at operation 522, the processing logic determines a value (e.g., by retrieving the value from a metadata structure) of a metric reflective of a number of programmed wordlines in the block. In some embodiments, operation 522 can include operations 521 and 523. For example, to retrieve the value of the metric, the processing logic can, at operation 521, reference a data structure containing information that associates each block with a corresponding metric value reflecting a portion of the wordlines in the block that are programmed wordlines. In some embodiments, the data structure can be a metadata structure that contains a plurality of entries, such that each entry maps each value of the metric to a corresponding read voltage offset. The processing logic can, at operation 523, identify, in the data structure, the value of the metric that is associated with the block specified by the read request. The data structure can reside or be stored in local memory 119, memory device 130, memory device 140, or in another location. As noted earlier, the processing logic can generate and store the data structure as it tracks the number of programmed WLs on a particular block. For example, the data structure can contain entries associating particular blocks with respective corresponding values of the metric. In some embodiments, the metric can be an absolute or relative number of programmed wordlines or of unprogrammed wordlines. In other embodiments, the metric can be a percentage or ratio of programmed wordlines to total wordlines, programmed wordlines to unprogrammed wordlines, or unprogrammed wordlines to total wordlines. In yet other embodiments, the metric can be an indication of the last wordline that was programmed (e.g., on a block) from which an inference regarding the number of programmed wordlines and the remaining unprogrammed wordlines can be made.

Thus, at operation 524, the processing logic can determine whether at least a predefined threshold number of wordlines of the block is connected to a corresponding set of erased memory cells. For example, the processing logic can, at operation 525, determine whether there is at least one unprogrammed wordline in the specified block. In some embodiments, having determined at operation 524 that the referenced block is a partial block, the processing logic can, at operation 526, identify in a record on a memory device (e.g., in the local memory 119, memory device 130, memory device 140, of FIG. 1 or in another location), a read voltage offset that corresponds to the value of the metric (e.g., the metric value that was previously retrieved). To identify the read voltage offset, in some embodiments, the processing logic can reference, at operation 527, a data structure that includes a record (e.g., on the memory device) that contains an association between the value of the metric and the corresponding read voltage offset. Thus, at operation 530, the processing logic can perform, using the read voltage offset, a read operation responsive to the read request. For example, in embodiments where the processing logic performing these operations controls the operation of the local media controller 135, which incorporates the memory access manager 113 of FIG. 1, after identifying the read voltage offset, the processing logic can at operation 528, directly apply the read voltage offset in a read operation performed on the memory cells of the block. Alternatively, in embodiments where the processing logic performing these operations controls the memory access manager 113 of FIG. 1, after identifying the read voltage offset, the processing logic can at operation 529, issue (e.g., to the memory device 130 or the local media controller 135 of FIG. 1) a read command that includes the read voltage offset.

Figure 6:
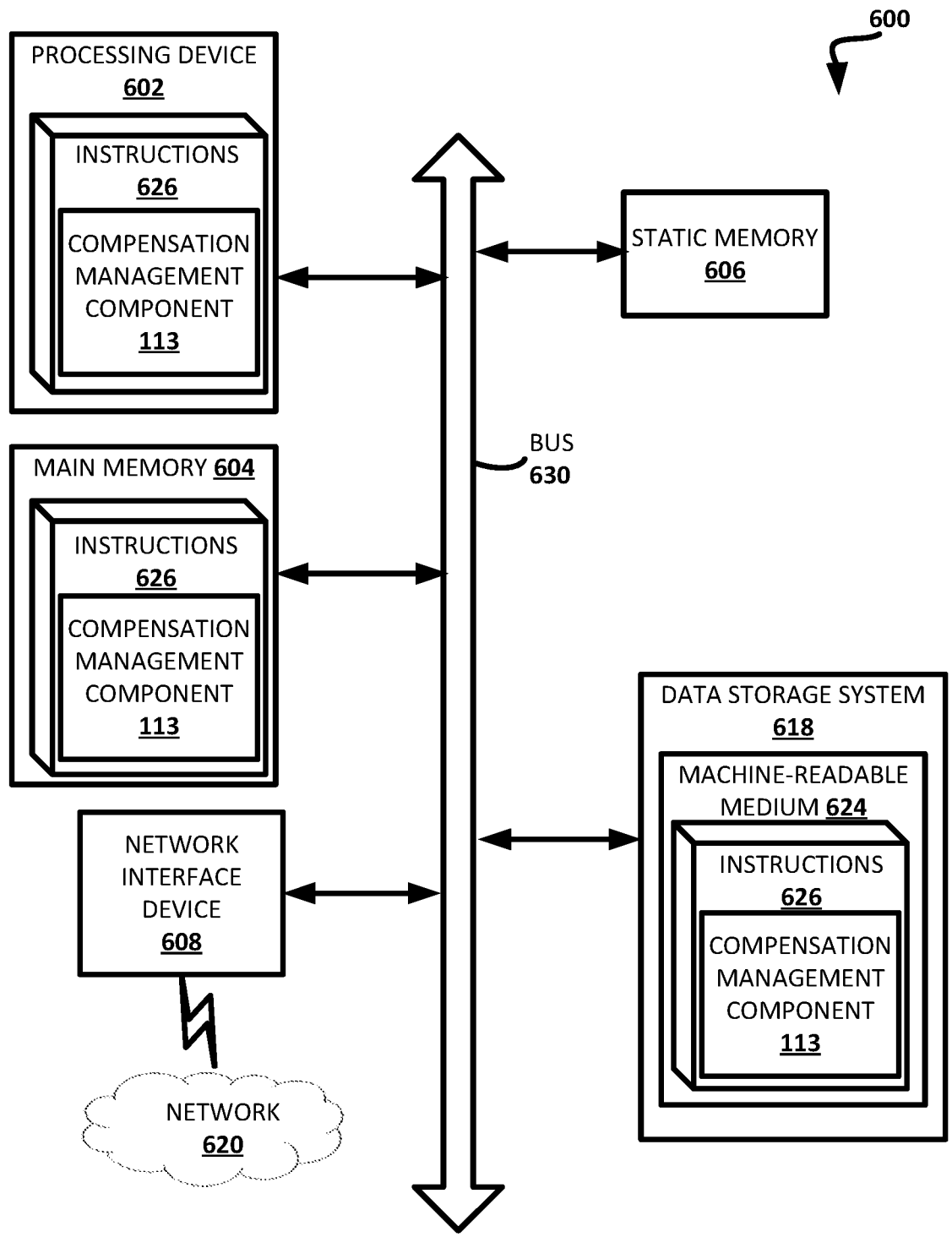
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the compensation management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a memory access manager (e.g., the memory access manager 113 of FIG. 1 and the methods 400, and 500 of FIGS. 4, and 5 respectively). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of blocks, each block of the plurality of blocks comprising a plurality of wordlines, each wordline of the plurality of wordlines connected to a respective set of memory cells; and
a processing device, operatively coupled with the memory device to perform operations comprising:
responsive to receiving a read request that specifies a block, determining a value of a metric reflective of a number of programmed wordlines of the block;
responsive to determining, based on the value of the metric, that the block is in a partially programmed state, identifying a read voltage offset corresponding to the value of the metric; and
performing, using the read voltage offset, a read operation responsive to the read request.

2. The system of claim 1, wherein identifying the read voltage offset comprises:
identifying, in a metadata structure, a record associating the value of the metric and the corresponding read voltage offset.

3. The system of claim 1, wherein determining whether the block is in a partially programmed state comprises:
determining whether at least one wordline in the block is connected to a corresponding set of erased memory cells.

4. The system of claim 1, wherein determining the value of the metric comprises:
identifying the value in a metadata structure.

5. The system of claim 4, wherein the metadata structure is stored in a local memory.

6. The system of claim 4, the metadata structure is stored on the memory device.

7. The system of claim 1, wherein the metric reflects a ratio of the number of programmed wordlines of the block to a total number of wordlines of the block.

8. A method comprising:
responsive to receiving a read request that specifies a block within a plurality of blocks of a memory device, determining a value of a metric reflective of a number of programmed wordlines of the block;
responsive to determining, based on the value of the metric, that the block is in a partially programmed state, identifying a read voltage offset corresponding to the value of the metric; and
performing, using the read voltage offset, a read operation responsive to the read request.

9. The method of claim 8, wherein identifying the read voltage offset comprises:
identifying, in a metadata structure, a record associating the value of the metric and the corresponding read voltage offset.

10. The method of claim 8, wherein determining whether the block is in a partially programmed state comprises:
determining whether at least one wordline in the block is connected to a corresponding set of erased memory cells.

11. The method of claim 8, wherein determining the value of the metric comprises:
identifying the value in a metadata structure.

12. The method of claim 11, wherein the metadata structure is stored in a local memory.

13. The method of claim 11, wherein the metadata structure is stored on the memory device.

14. The method of claim 8, wherein the metric reflects a ratio of the number of programmed wordlines of the block to a total number of wordlines of the block.

15. A non-transitory computer-readable storage medium comprising instructions that, when executed by a processing device, cause the processing device to perform operations comprising:
- receiving a read request that specifies a block within a plurality of blocks, the block comprising a plurality of wordlines on a memory device;
- responsive to receiving the read request, determining a value of a metric reflective of a number of programmed wordlines of the block;
- responsive to determining, based on the value of the metric, that the block is in a partially programmed state, identifying a read voltage offset corresponding to the value of the metric; and
- issuing, to the memory device, a read command comprising the read voltage offset.

16. The non-transitory computer-readable storage medium of claim 15, wherein identifying the read voltage offset comprises:
- identifying, in a metadata structure, a record associating the value of the metric and the corresponding read voltage offset.

17. The non-transitory computer-readable storage medium of claim 15, wherein determining whether the block is in a partially programmed state comprises:
- determining whether at least one wordline of the block is connected to a corresponding set of erased memory cells.

18. The non-transitory computer-readable storage medium of claim 15, wherein determining the value of the metric comprises:
- identifying the value in a metadata structure.

19. The non-transitory computer-readable storage medium of claim 18, wherein the metadata structure is stored in a local memory.

20. The non-transitory computer-readable storage medium of claim 18, wherein the metric is a count of programmed wordlines of the block.

* * * * *